United States Patent [19]
Yamaue et al.

[11] Patent Number: 5,883,683
[45] Date of Patent: Mar. 16, 1999

[54] NONLINEAR DEVICE

[75] Inventors: Satoshi Yamaue, Tenri; Masaru Yoshida, Ikoma-gun, both of Japan

[73] Assignee: Sharp Kabushiki Kaisha, Osaka, Japan

[21] Appl. No.: 888,852

[22] Filed: Jul. 7, 1997

[30] Foreign Application Priority Data

Jul. 8, 1996 [JP] Japan ..................................... 8-178345

[51] Int. Cl.⁶ .............................. G02F 1/136; H01L 49/02
[52] U.S. Cl. ............................................... 349/49; 257/614
[58] Field of Search ................................ 349/49, 139, 50, 349/143, 51, 52, 53; 257/59, 613, 72, 614, 762, 763, 766, 770; 345/90, 91

[56] References Cited

U.S. PATENT DOCUMENTS

| | | | |
|---|---|---|---|
| 5,552,910 | 9/1996 | Okano | 349/50 |
| 5,600,458 | 2/1997 | Okano et al. | 349/50 |
| 5,734,452 | 3/1998 | Yamaue et al. | 349/49 |
| 5,739,547 | 4/1998 | Nomura et al. | 257/59 |

FOREIGN PATENT DOCUMENTS

| | | |
|---|---|---|
| 61-32674 | 7/1986 | Japan. |
| 6-17957 | 3/1994 | Japan. |
| 7-134315 | 5/1995 | Japan. |

*Primary Examiner*—William L. Sikes
*Assistant Examiner*—Tai V. Duong
*Attorney, Agent, or Firm*—David G. Conlin; David S. Resnick; Dike, Bronstein, Roberts & Cushman, LLP

[57] ABSTRACT

A nonlinear device of the present invention includes: a first electrode and a second electrode at least partially opposing each other; and a nonlinear resistant layer made of a material mainly containing zinc sulfide, formed so as to be in contact with the first electrode and the second electrode, wherein at least one of the first electrode and the second electrode is made of an electrode material satisfying a relationship $\Delta G_M - \Delta G_{Zn} > 0$, where $\Delta G_M$ is standard free energy of a generation reaction of a sulfide of the electrode material and $\Delta G_{Zn}$ is standard free energy of a generation reaction of a sulfide of zinc.

3 Claims, 3 Drawing Sheets

Nonlinear element

Nonlinear element

NONLINEAR DEVICE

BACKGROUND OF THE INVENTION

1. Field of the Invention

The present invention relates to a nonlinear device, for example, used for driving an active matrix type liquid crystal display apparatus.

2. Description of the Related Art

As the above-mentioned nonlinear device, a thin film transistor (TFT) which is a three-terminal device, a thin film diode (TFD) which is a two-terminal device, and the like are known. In particular, the two-terminal device has a simpler structure in which a nonlinear resistant layer is provided between a pair of electrodes and requires fewer masks for production, compared with the three-terminal device such as a TFT. Thus, the two-terminal device holds promise of reducing production cost.

At present, nonlinear devices using tantalum oxide (Japanese Patent Publication No. 61-32674), silicon nitride or silicon oxide (Japanese Patent Publication No. 6-17957), zinc sulfide (Japanese Laid-Open Patent Publication No. 7-134315), etc. for nonlinear resistant layers have been developed. Particularly, in nonlinear devices using zinc sulfide for a nonlinear resistant layer, the nonlinearity of I (current)-V (voltage) characteristics is large, and the I-V characteristics can be controlled by doping impurities into the zinc sulfide. Therefore, such a nonlinear device has the advantage in that the I-V characteristics can be designed in accordance with the electro-optic characteristics of a display medium. Thus, a display apparatus with a high contrast can be realized by using, as a switching device, a nonlinear device which uses zinc sulfide for a nonlinear resistant layer.

FIG. 3 is a cross-sectional view of a conventional nonlinear device using zinc sulfide for a nonlinear resistant layer. This nonlinear device includes a first electrode 52 having a predetermined shape on an insulating substrate 51 and a nonlinear resistant layer 53 composed of a material mainly containing zinc sulfide formed so as to cover the first electrode 52. An interlevel insulator 54 having a contact hole 54a is formed on the nonlinear resistant layer 53, and a second electrode 56 is formed on the interlevel insulator 54 so as to fill the inside of the contact hole 54a. The second electrode 56 is in contact with the nonlinear resistant layer 53 in the contact hole 54a of the interlevel insulator 54. This nonlinear device has a structure in which the nonlinear resistant layer 53 is in contact with the first and second electrodes 52 and 56.

Hereinafter, the case using aluminum, for example, as a material for the above-mentioned second electrode 56 will be considered. In the case where the temperature of the nonlinear device increases when the nonlinear resistant layer 53 is mainly made of zinc sulfide and the second electrode 56 is mainly made of aluminum being in contact with each other, aluminum reacts with sulfur to generate aluminum sulfide. Aluminum sulfide is generated for the following reason: the standard free energy $\Delta G_{Al}$ of the reaction, in which aluminum reacts with sulfur to generate a sulfide, has a negative value lower than the standard free energy $\Delta G_{Zn}$ of the reaction in which zinc reacts with sulfur to generate a sulfide.

Hereinafter, the reaction of the generation of aluminum sulfide will be described in terms of thermodynamics.

Whether or not the reaction spontaneously proceeds under the given condition is determined by the sum $\Delta S_T$ of the entropy change $\Delta S_{sys}$ of a reaction system and the entropy change $\Delta S_{sur}$ of the surroudings of the reaction system represented by the following equation (1).

$$\Delta S_T = \Delta S_{sys} + \Delta S_{sur} \quad (1)$$

According to the Second Law of Thermodynamics, the reaction spontaneously proceeds at $\Delta S_T > 0$. Here, the spontaneous reaction under constant pressure is considered. Under constant pressure, the following equation (2) holds.

$$\Delta S_{sur} = -(\Delta H/T) \quad (2)$$

where H is the enthalpy, and T is the temperature.

It is understood from the equations (1) and (2) that the following equation (3) should hold so as to allow the reaction to spontaneously proceed.

$$\Delta H - T\Delta S_{sys} < 0 \quad (3)$$

$\Delta H - T\Delta S_{sys}$ in the equation (3) is known as Gibbs free energy $\Delta G$. The reaction spontaneously proceeds at $\Delta G = \Delta H - T\Delta S_{sys} < 0$.

For example, the reaction between zinc and aluminum can be represented as follows. The standard free energy $\Delta G_{Al}$ of the reaction in which aluminum reacts with sulfur to generate a sulfide at room temperature is about −130 kcal, and the standard free energy $\Delta G_{Zn}$ of the reaction in which zinc reacts with sulfur to generate a sulfide at room temperature is about −110 kcal. Thus, these reactions can be represented by the following equations (4) and (5).

$$(4/3)Al + S_2 = (2/3)Al_2S_3 \, \Delta G = -130 \text{ kcal} \quad (4)$$

$$2Zn + S_2 = 2ZnS \, \Delta G = -110 \text{ kcal} \quad (5)$$

The standard free energy $\Delta G$ of the reaction in which aluminum is brought into contact with zinc sulfide can be obtained from the equations (4) and (5). The result is represented by the following equation (6).

$$(4/3)Al + 2ZnS = (2/3)Al_2S_3 + 2Zn \, \Delta G = -20 \text{ kcal} \quad (6)$$

It is understood from the equation (6) that the change in standard free energy is −20 kcal.

As described above, when the standard free energy $\Delta G$ of the reaction has a negative value, the reaction proceeds spontaneously. As $\Delta G$ has a smaller negative value, the reaction is more likely to proceed. Therefore, in the case where zinc sulfide is in contact with aluminum, zinc sulfide is desulfurized to become zinc, and aluminum reacts with sulfur to generate aluminum sulfide.

In the nonlinear device used as a switching device, large nonlinearity of I-V characteristics, satisfactory symmetry of I-V characteristics, stable I-V characteristics, and the like are required.

When considering the nonlinear device using zinc sulfide for a nonlinear resistant layer for the above-mentioned characteristics, the nonlinearlity of I-V characteristics is large. Therefore, such a nonlinear device is considered to be suitable as a switching device. However, when highly reactive zinc sulfide is used for the nonlinear resistant layer, sulfur contained in zinc sulfide may react with an electrode material. As a result, there is a problem that the state of the interface between the nonlinear resistant layer and the electrode tends to change, rendering I-V characteristics to vary over time.

FIG. 4 shows an example of change in I-V characteristics over time of the nonlinear device as described above. FIG. 4 shows I-V characteristics of a nonlinear device using zinc sulfide doped with nickel for a nonlinear resistant layer and aluminum for an electrode. As is understood from FIG. 4, in this nonlinear resistant layer, I-V characteristics 32 after aging are shifted toward a lower voltage side, compared with initial I-V characteristics 31.

When a nonlinear device in which I-V characteristics change over time is used as a switching device of a display apparatus, the I-V characteristics are shifted toward a lower voltage side over the passage of operation time of the display apparatus. This allows liquid crystal to be driven on a lower voltage side, resulting in a decrease in a display contrast, etc.

SUMMARY OF THE INVENTION

The nonlinear device of this invention includes a first electrode and a second electrode at least partially opposing each other; and a nonlinear resistant layer made of a material mainly containing zinc sulfide, formed so as to be in contact with the first electrode and the second electrode, wherein at least one of the first electrode and the second electrode is made of an electrode material satisfying a relationship $\Delta G_M \times \Delta G_{Zn} > 0$, where $\Delta G_M$ is standard free energy of a generation reaction of a sulfide of the electrode material and $\Delta G_{Zn}$ is standard free energy of a generation reaction of a sulfide of zinc.

In another embodiment, at least one of the first electrode and the second electrode is made of at least one of the group consisting of W, Fe, Pt, Pb, Si, Mo, Ag and Cu.

According to the present invention, at least one of the first electrode and the second electrode is made of an electrode material satisfying a relationship $\Delta G_M - \Delta G_{Zn} > 0$, where $\Delta G_M$ is the standard free energy of a generation reaction of a sulfide of the electrode material and $\Delta G_{Zn}$ is the standard free energy of the generation reaction of a sulfide of zinc.

The electrode material satisfying the relationship generates a sulfide more slowly than zinc. Therefore, the electrode can be prevented from reacting with the sulfur contained in the zinc sulfide.

As the electrode material satisfying the relationship, W, Fe, Pt, Pb, Si, Mo, Ag, Cu, and the like can be used. These materials can be used alone or in combination.

Thus, the invention described herein makes possible the advantage of providing a nonlinear device with stable I-V characteristics.

This and other advantages of the present invention will become apparent to those skilled in the art upon reading and understanding the following detailed description with reference to the accompanying figures.

DESCRIPTION OF THE PREFERRED EMBODIMENTS

According to the present invention, at least one of the first and second electrodes is composed of a material satisfying a relationship: $\Delta G_M - \Delta G_{Zn} > 0$, where $\Delta G_M$ is the standard free energy in a generation reaction of a sulfide of an electrode material, and $\Delta G_{Zn}$ is the standard free energy in the generation reaction of a sulfide of zinc, for the following reason.

The generation reaction of a sulfide of zinc can be represented by the following equation (7).

$$2Zn + S_2 = 2ZnS \quad \Delta G = \Delta G_{Zn} \quad (7)$$

Assuming that the standard free energy of the generation reaction of a sulfide of an electrode material M is $\Delta G_M$, the generation reaction of a sulfide of an electrode material of the first electrode and an electrode material of the second electrode can be represented by the following equation (8).

$$\alpha M + S_2 = \beta M_x S_y \quad \Delta G = \Delta G_M \quad (8)$$

where $\alpha$ is the parameter of a component M, and $\beta$ is the parameter of a component $M_x S_y$.

From the equations (7) and (8), the reaction in the case where the electrode material M is brought into contact with zinc sulfide can be represented by the following equation (9).

$$\alpha M + 2ZnS = \beta M_x S_y + 2Zn \quad \Delta G = (\Delta G_M - \Delta G_{Zn}) \quad (9)$$

As described above, whether or not the reaction represented by the equation (9) proceeds is determined by the value of $\Delta G$. This shows that the reaction proceeds at $\Delta G < 0$, and the electrode material M reacts with sulfur of zinc sulfide to form another sulfide.

Thus, in the case where the electrode material M which satisfies $(\Delta G_M - \Delta G_{Zn}) > 0$ is used, the sulfidization of the electrode does not proceed even when zinc sulfide is brought into contact with the electrode material M, and the I-V characteristics of the linear device do not change over time. In a display apparatus using such a nonlinear device, the nonuniformity of a display and the decrease in display contrast are not caused. Therefore, a highly reliable display apparatus of good quality can be obtained.

As an electrode material satisfying the relationship: $(\Delta G_M - \Delta G_{Zn}) > 0$, one selected from the group consisting of W, Fe, Pt, Pb, Si, Mo, Ag and Cu can be used. As long as this relationship is satisfied, two or more of these materials can be used, or another electrode material can be used. Furthermore, an alloy of a plurality of electrode materials can be used. The electrode material of the first electrode may be different from that of the second electrode.

Hereinafter, the present invention will be described by way of illustrative embodiments with reference to the drawings.

Embodiment 1

In this embodiment, the nonlinear device of the present invention is used in a reflective White Taylor type guest-host liquid crystal display apparatus.

Figure 1A:
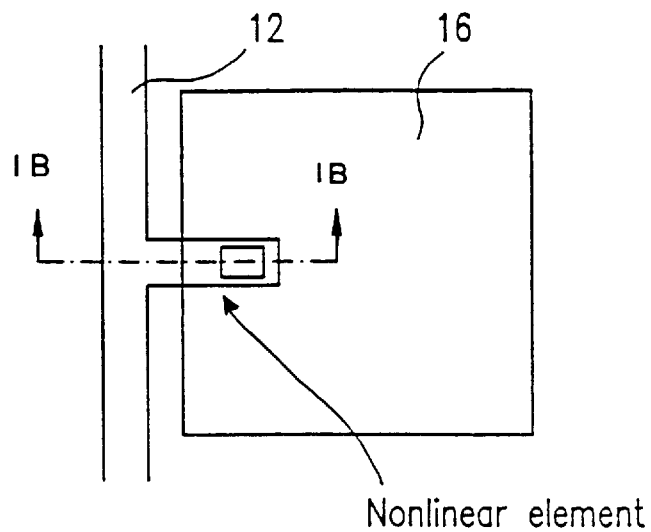
FIG. 1A is a plan view showing one pixel portion of a device side substrate on which a nonlinear device of Embodiment 1 is provided.
Figure 1B:
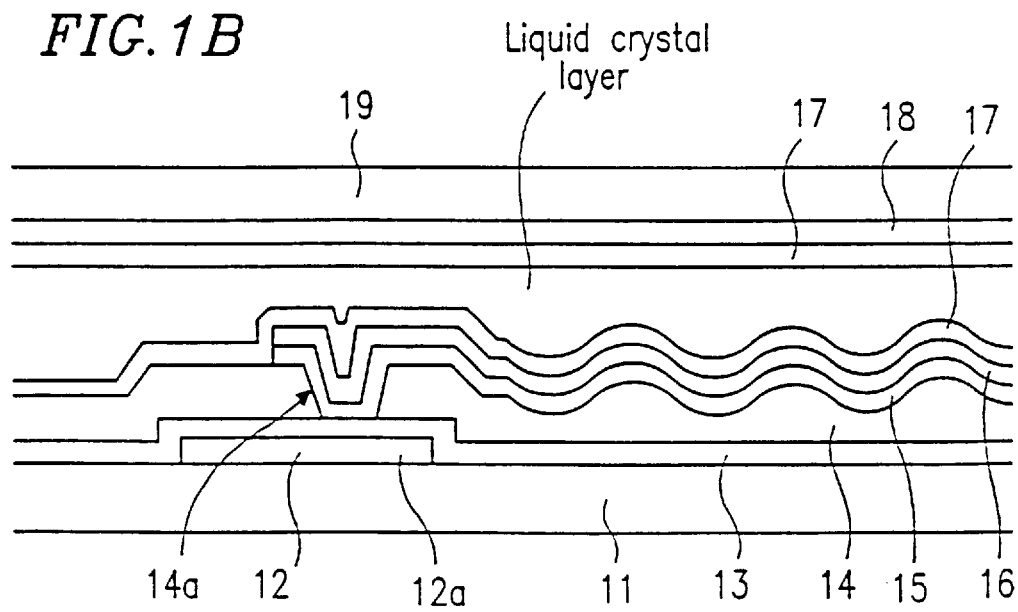
FIG. 1B is a cross-sectional view of a liquid crystal display apparatus taken along a line A—A' of FIG. 1A.

FIG. 1A is a plan view showing one pixel portion of a substrate (hereinafter, referred to as a device side substrate) on which a nonlinear device of the present embodiment is provided. FIG. 1B is a cross-sectional view of a liquid crystal display apparatus taken along a line A—A' of FIG. 1A. In the device side substrate, a scanning line 12 and a first electrode 12a which is a part of the scanning line 12 are provided on an insulating substrate 11. A nonlinear resistant layer 13 mainly containing zinc sulfide is formed so as to cover the scanning line 12 and the first electrode 12a. The scanning line 12 and the first electrode 12a are made of W, and the nonlinear resistant layer 13 is composed of a zinc sulfide film containing nickel. An insulating film 14 with a contact hole 14a reaching the nonlinear resistant layer 13, is formed on the nonlinear resistant layer 13, and a second electrode 15 is formed so as to fill the inside of the contact hole 14a. The second electrode 15 is made of W and is in contact with the nonlinear resistant layer 13 in the contact hole 14a of the insulating film 14. The nonlinear resistant layer 13 is in contact with the first electrode 12a and the second electrode 15, and the nonlinear device is formed at the superposed portion of the first electrode 12a, the nonlinear resistant layer 13 and the second electrode 15. A pixel electrode 16 is formed on the second electrode 15, and an alignment film 17 is formed on the pixel electrode 16. The device side substrate is attached to a counter substrate on which a counter electrode 18 is formed on an insulating substrate 19, and a liquid crystal layer is sealed in a gap between the substrates.

The liquid crystal display apparatus can be produced as follows.

First, a production process of the device side substrate will be described. A W film is formed to a thickness of about 200 nm by sputtering W onto the insulating substrate 11, which is made of glass or the like, and patterned to a predetermined shape, whereby the scanning electrode 12 and the first electrode 12a are formed.

Then, the nonlinear resistant layer 13 is formed by sputtering. In this embodiment, using a sintering target of zinc sulfide mixed with 0.3 wt % nickel, argon gas and hydrogen gas are introduced into a chamber as the sputtering gas at a flow rate of 50 sccm and 5 sccm, respectively, and a zinc sulfide film with a thickness of 100 nm containing nickel is formed by sputtering. Thus, the nonlinear resistant layer 13 is formed.

Next, the insulating film 14 is formed on the resultant substrate, and the contact hole 14a for connecting the nonlinear resistant layer 13 to the second electrode 15 is provided. In this embodiment, an organic photosensitive resin is coated to a thickness of about 1.4 µm by spin coating, and then, the coating is exposed to light and developed, whereby the insulating film 14 with the contact hole 14a is formed. Thereafter, the surface of the insulating film 14 is treated by a photo process to form unevenness on the surface of the insulating film 14.

Thereafter, a W film is formed to a thickness of about 100 nm as the second electrode 15 by sputtering, and an Al film is formed to a thickness of about 100 nm. The W film and the Al film are patterned to identical shapes, whereby the second electrode 15 and the pixel electrode 16 are formed. Thus, the device side substrate is completed.

The counter electrode 18 made of ITO (Indium Tin Oxide) is formed on the insulating substrate 19 made of glass or the like.

An alignment film 17 is coated onto the electrode-formed surface of the device side substrate and the counter substrate, respectively. The resultant surfaces are subjected to alignment. The device side substrate is attached to the counter substrate with the alignment films 17 therebetween. Finally, a White Taylor type guest-host liquid crystal is sealed in a gap between the substrates to provide a liquid crystal layer, whereby a reflective liquid crystal display apparatus is completed.

In the reflective liquid crystal display apparatus thus obtained, the I-V characteristics of the nonlinear device do not change over time, and a stable display is obtained after aging for a long period of time.

Embodiment 2

In this embodiment, the nonlinear device of the present invention is used in a transmission type liquid crystal display apparatus.

Figure 2A:
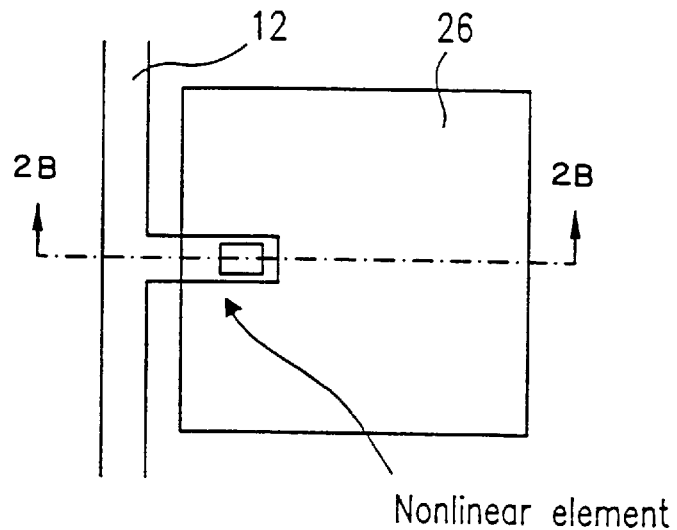
FIG. 2A is a plan view showing one pixel portion of a device side substrate on which a nonlinear device of Embodiment 2 is provided.
Figure 2B:
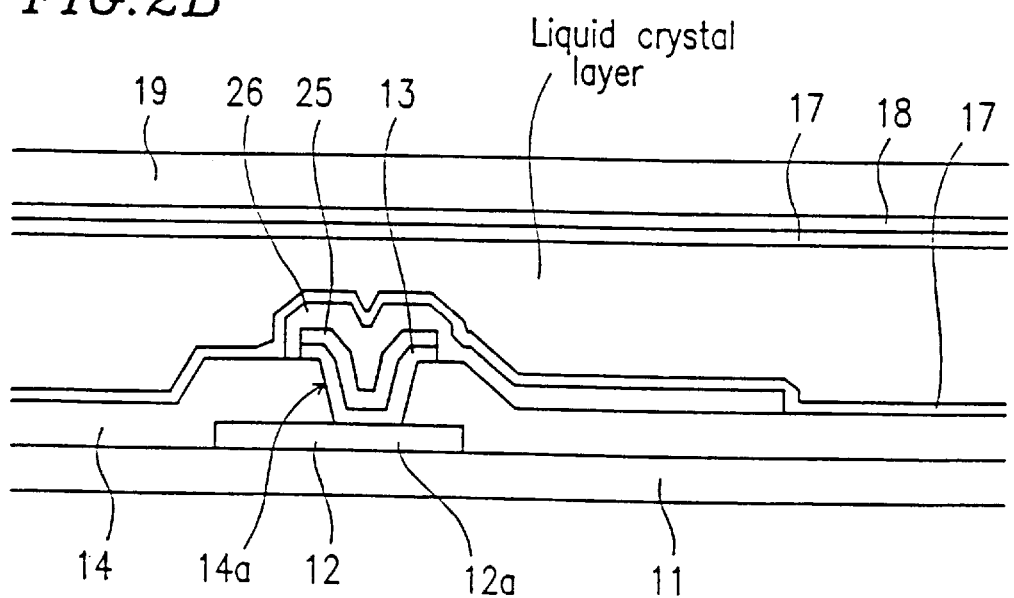
FIG. 2B is a cross-sectional view of a liquid crystal display apparatus taken along a line B—B' of FIG. 2A.
Figure 3:
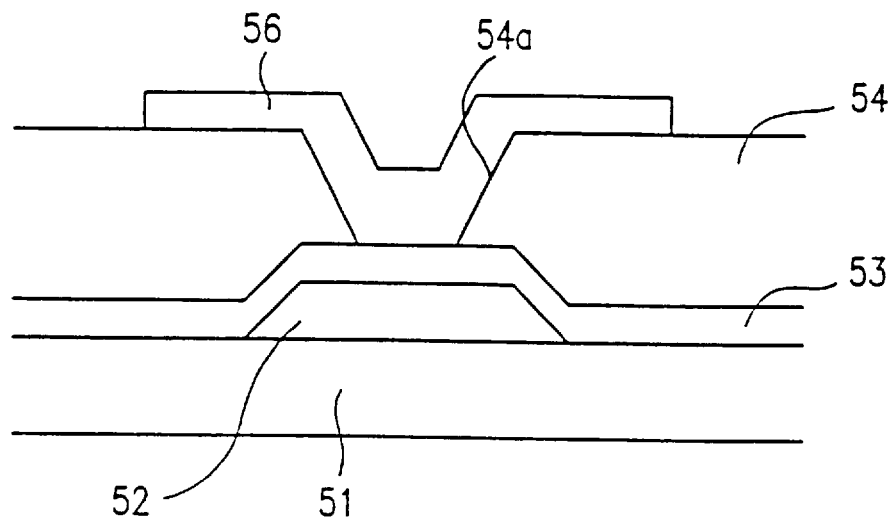
FIG. 3 is a cross-sectional view showing an example of a structure of a conventional nonlinear device.
Figure 4:
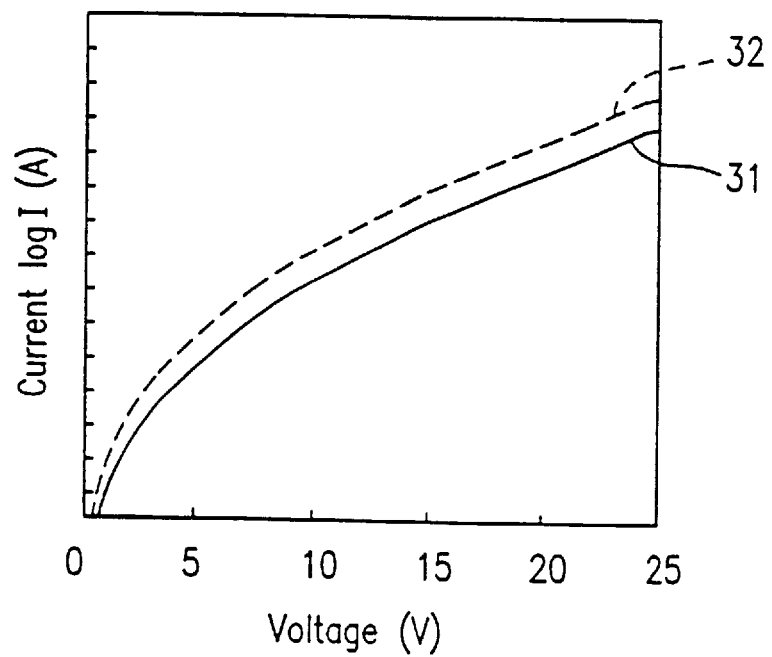
FIG. 4 is a graph showing change over time in I-V characteristics of a conventional nonlinear device.

FIG. 2A is a plan view showing one pixel portion of a substrate (hereinafter, referred to as a device side substrate) on which a nonlinear device of the present embodiment is provided. FIG. 2B is a cross-sectional view of a liquid crystal display apparatus taken along a line B—B' of FIG. 2A. In the device side substrate, a scanning line 12 and a first electrode 12a which is a part of the scanning line 12 are provided on an insulating substrate 11. An insulating film 14 with a contact hole 14a reaching the first electrode 12a is formed so as to cover the scanning line 12 and the first electrode 12a. A nonlinear resistant layer 13 mainly containing zinc sulfide is formed on the insulating film 14 so as to fill the inside of the contact hole 14a. A second electrode 25 is formed on the nonlinear resistant layer 13. The nonlinear device has a structure in which the first electrode 12a, the nonlinear resistant layer 13 and the second electrode 25 are in contact with each other, and formed at the superposed portion thereof. A pixel electrode 26 is formed on the second electrode 25, and an alignment film 17 is formed so as to cover the pixel electrode 26. The device side substrate is attached to a counter substrate in which a counter electrode 18 is formed on an insulating substrate 19, and a liquid crystal layer is sealed in a gap between the substrates.

The liquid crystal display apparatus can be produced as follows.

First, a production process of the device side substrate will be described. A W film is formed to a thickness of about 200 nm by sputtering W onto the insulating substrate 11, which is made of glass or the like, and patterned to a predetermined shape, whereby the scanning line 12 and the first electrode 12a are formed.

Then, the insulating film 14 is formed on the insulating substrate 11, and a contact hole 14a for connecting the first electrode 12a to the nonlinear resistant layer 13 is provided. In this embodiment, an organic photosensitive resin is coated to a thickness of about 1.4 µm by spin coating, and then, the coating is exposed to light and developed, whereby the insulating film 14 with the contact hole 14a is formed.

Then, a zinc sulfide film doped with 0.2 wt % nickel is formed to a thickness of about 100 nm by sputtering, and a W film is formed to a thickness of about 100 nm. The zinc sulfide film and the W film are patterned to identical shapes to form the nonlinear resistant layer 13 and the second electrode 25.

Thereafter, a transparent electrode made of ITO is patterned to form the pixel electrode 26. Thus, the device side substrate is completed.

The counter electrode 18 made of ITO is formed on the insulating substrate 19 made of glass or the like.

An alignment film 17 is coated onto the electrode-formed surface of the device side substrate and the counter substrate, respectively. The resultant surfaces are subjected to alignment. The device side substrate is attached to the counter substrate with the alignment films 17 therebetween. Finally, TN (twisted nematic) liquid crystal is sealed in a gap between the substrates to provide a liquid crystal layer, whereby a transmission type liquid crystal display apparatus is completed.

In the transmission type liquid crystal display apparatus thus obtained, the I-V characteristics of the nonlinear device do not change over time, and a stable display is obtained after aging for a long period of time.

As the nonlinear device to which the present invention is applicable, a nonlinear device having a nonlinear resistant layer containing zinc sulfide which is not pure and a nonlinear device having a nonlinear resistant layer containing zinc sulfide including impurities and the like can be used, as long as they mainly contain zinc sulfide. In the case where impurities are contained in zinc sulfide, the I-V characteristics of the nonlinear device can be designed in accordance with the characteristics of a display medium.

As a material for the above-mentioned insulating film, those other than an organic photosensitive resin can be used, and inorganic films of silicon nitride, silicon oxide, or the like can be used. In the case where a photosensitive resin is used, the patterning step can be simplified.

As is apparent from the above description, according to the present invention, the first and second electrodes can be prevented from reacting with the sulfur contained in zinc sulfide to form another sulfide. Therefore, the state in the vicinity of the interface between the nonlinear resistant layer and the electrode can be made stable, preventing the I-V characteristics of the nonlinear device from changing over time. Furthermore, by using a nonlinear device having the I-V characteristics with outstanding stability as a switching device, the nonuniformity of a display and decrease in display contrast are prevented, thereby realizing a highly reliable display apparatus of good quality.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonlinear device comprising:
   a first electrode and a second electrode at least partially opposing each other; and
   a nonlinear resistant layer made of material mainly containing zinc sulfide, formed so as to be in contact with the first electrode and the second electrode,
   wherein the first electrode and the second electrode are made of an electrode material satisfying a relationship $\Delta G_M - \Delta G_{Zn} > 0$, where $\Delta G_M$ is standard free energy of a generation reaction of a sulfide of the electrode material and $\Delta G_{Zn}$ is standard free energy of a generation reaction of a sulfide of zinc.

2. A nonlinear device according to claim 1, wherein the first electrode and the second electrode are made of at least one of the group consisting of W, Fe, Pt, Pb, Si, Mo, Ag and Cu.

3. A nonlinear device, comprising:
   a first electrode and a second electrode at least partially opposing each other; and
   a nonlinear resistant layer made of a material mainly containing zinc sulfide, formed so as to be in contact with the first electrode and the second electrode,
   wherein at least one of the first electrode and the second electrode is made of an electrode material satisfying a relationship $\Delta G_M - \Delta G_{Zn} > 0$, where $\Delta G_M$ is standard free energy of a generation reaction of a sulfide of the electrode material and $\Delta G_{Zn}$ is standard free energy of a generation reaction of a sulfide of zinc, and at least one of the first electrode and the second electrode is made of at least one of the group consisting of W, Fe, Pt, Pb, Si, Ag and Cu.

* * * * *